(12) United States Patent
Kishimoto et al.

(10) Patent No.: US 12,276,822 B2
(45) Date of Patent: Apr. 15, 2025

(54) DISPLAY DEVICE

(71) Applicant: Samsung Display Co., Ltd., Yongin-Si (KR)

(72) Inventors: Hirotsugu Kishimoto, Gyeonggi-do (KR); Chul Ho Jeong, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 619 days.

(21) Appl. No.: 17/329,572

(22) Filed: May 25, 2021

(65) Prior Publication Data

US 2022/0091319 A1    Mar. 24, 2022

(30) Foreign Application Priority Data

Sep. 22, 2020    (KR) .......................... 10-2020-0122172

(51) Int. Cl.
*G02B 5/30*      (2006.01)
*G06F 3/046*    (2006.01)
*H10K 59/40*   (2023.01)

(52) U.S. Cl.
CPC ......... *G02B 5/3083* (2013.01); *G02B 5/3025* (2013.01); *G06F 3/046* (2013.01); *H10K 59/40* (2023.02)

(58) Field of Classification Search
CPC ...... G02B 5/3083; G02B 5/3025; G02B 5/30; G02B 5/3033; H10K 59/40; G06F 3/046; G06F 3/041
See application file for complete search history.

(56) References Cited

U.S. PATENT DOCUMENTS

| 10,083,636 B2 | 9/2018 | Han |
| 2018/0212200 A1 | 7/2018 | Wang et al. |
| 2018/0321764 A1* | 11/2018 | Oh ........................ H10K 50/844 |
| 2019/0086709 A1* | 3/2019 | Lee ................... G02F 1/133308 |
| 2020/0073493 A1* | 3/2020 | Chen ................... H10K 59/8791 |
| 2020/0105169 A1* | 4/2020 | Jeong ..................... H10K 50/86 |

(Continued)

FOREIGN PATENT DOCUMENTS

| KR | 1020160027376 A | 3/2016 |
| KR | 20180021299 A | 3/2018 |

(Continued)

OTHER PUBLICATIONS

Park et al., KR 20160027376 A, published Mar. 10, 2016, English language machine translation, generated Sep. 25, 2023 ( Year: 2016).*

*Primary Examiner* — Stephone B Allen
*Assistant Examiner* — Adam W Booher
(74) *Attorney, Agent, or Firm* — CANTOR COLBURN LLP

(57) ABSTRACT

A display device includes a window, a polarizing layer disposed directly on a lower portion of the window or attached to the lower portion of the window by an adhesive layer having a thickness smaller than about 5 micrometers, a retard layer disposed under the polarizing layer, and a display panel disposed under the polarizing layer. The retard layer includes a first retard layer and a second retard layer. At least one selected from a functional layer and a support plate is further disposed under the display panel. The functional layer includes at least one selected from a cushion layer and a digitizer, and the functional layer has a step difference.

20 Claims, 6 Drawing Sheets

(56) References Cited

U.S. PATENT DOCUMENTS

| | | | |
|---|---|---|---|
| 2020/0209998 A1* | 7/2020 | Shin | G06F 1/1641 |
| 2020/0264356 A1* | 8/2020 | Lee | H10K 50/86 |
| 2021/0104693 A1* | 4/2021 | Cho | B32B 27/065 |
| 2022/0043538 A1* | 2/2022 | Kishimoto | G06F 3/046 |

FOREIGN PATENT DOCUMENTS

| KR | 20190032686 A | 3/2019 |
|---|---|---|
| KR | 20200084495 A | 7/2020 |

* cited by examiner

DISPLAY DEVICE

This application claims priority to Korean Patent Application No. 10-2020-0122172, filed on Sep. 22, 2020, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device with improved display quality.

2. Description of the Related Art

Recently, display devices, such as a liquid crystal display device, a plasma display panel, an organic light emitting display device, a field effect display device, an electrophoretic display device, and the like, are widely used in various fields as a medium to transmit visual information.

Such a display device typically display images through a display surface thereof to provide visual information to a user. The display device may prevent a reflection of external light therein to display the images with high quality.

SUMMARY

The disclosure provides a display device with improved display quality.

An embodiment of the invention provides a display device including a window, a polarizing layer disposed directly on a lower portion of the window or attached to the lower portion of the window by an adhesive layer having a thickness less than about 5 micrometers, a retard layer disposed under the polarizing layer, and a display panel disposed under the polarizing layer.

In an embodiment, the retard layer may be disposed between the polarizing layer and the display panel.

In an embodiment, the polarizing layer may be a coating layer.

In an embodiment, the display device may further include a functional layer disposed under the display panel, where a bump portion may be defined in the functional layer.

In an embodiment, the functional layer may include a cushion layer in which a bubble having a size equal to or greater than about 1 micrometer may be defined.

In an embodiment, the functional layer may include a digitizer having a thickness equal to or greater than about 5 micrometers.

In an embodiment, the retard layer may include a first retard layer disposed under the polarizing layer and a second retard layer disposed between the first retard layer and the polarizing layer.

In an embodiment, the first retard layer may be a $\lambda/4$ retarder, and the second retard layer may be a $\lambda/2$ retarder.

In an embodiment, the polarizing layer may be a linear polarizer.

In an embodiment, the window may include a glass material.

In an embodiment, the window may have a thickness equal to or greater than about 20 micrometers and equal to or less than about 80 micrometers.

In an embodiment, the display panel may be foldable about a folding axis.

An embodiment of the invention provides a display device including a window, a coating layer coated on a lower portion of the window, a retard layer disposed under the coating layer, and a display panel disposed under the coating layer, where the coating layer includes a polarizing material.

In an embodiment, the retard layer may include a first retard layer disposed under the coating layer and a second retard layer disposed between the first retard layer and the coating layer, where the first retard layer may be a $\lambda/4$ retarder, and the second retard layer may be a $\lambda/2$ retarder.

In an embodiment, the display device may further include a functional layer disposed under the display panel, and the functional layer may include at least one selected from a cushion layer and a digitizer.

In an embodiment, the display device may further include a support plate disposed under the display panel.

An embodiment of the invention provides a display device including a window, an adhesive layer disposed under the window, a polarizing layer disposed under the adhesive layer, and a display panel disposed under the polarizing layer, where the adhesive layer has a thickness less than about 5 micrometers.

In an embodiment, the adhesive layer may be disposed directly on a lower portion of the window, and the polarizing layer may be disposed directly on a lower portion of the adhesive layer.

In an embodiment, the display device may further include a functional layer disposed under the display panel, where the functional layer may include at least one selected from a cushion layer and a digitizer.

In an embodiment, the display device may further include a first retard layer disposed under the polarizing layer and a second retard layer disposed between the first retard layer and the polarizing layer, where the first retard layer may be a $\lambda/4$ retarder, and the second retard layer may be a $\lambda/2$ retarder.

According to embodiments as described herein, the reliability of the polarizing layer of the display device is improved, and thus, the display device provides images with improved display quality to the user.

BRIEF DESCRIPTION OF THE DRAWINGS

The above and other features of the disclosure will become readily apparent by reference to the following detailed description when considered in conjunction with the accompanying drawings, in which.

DETAILED DESCRIPTION

Figure 1:
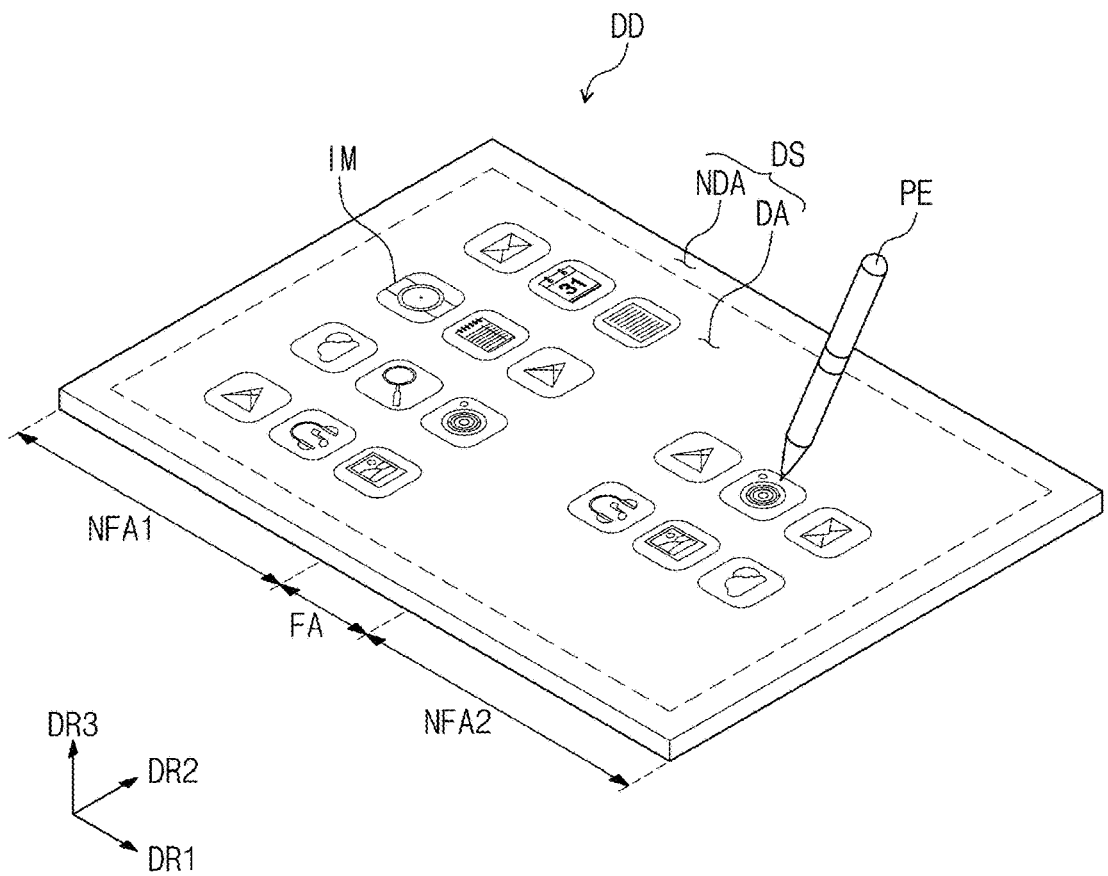
FIG. 1 is an assembled perspective view showing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on", "connected to" or "coupled to" another element or layer, it can be directly on, connected or coupled to the other element or layer or intervening elements or layers may be present therebetween. In contrast, when an element is referred to as being "directly on", "connected directly to" or "coupled directly to" another element, there are no intervening elements present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
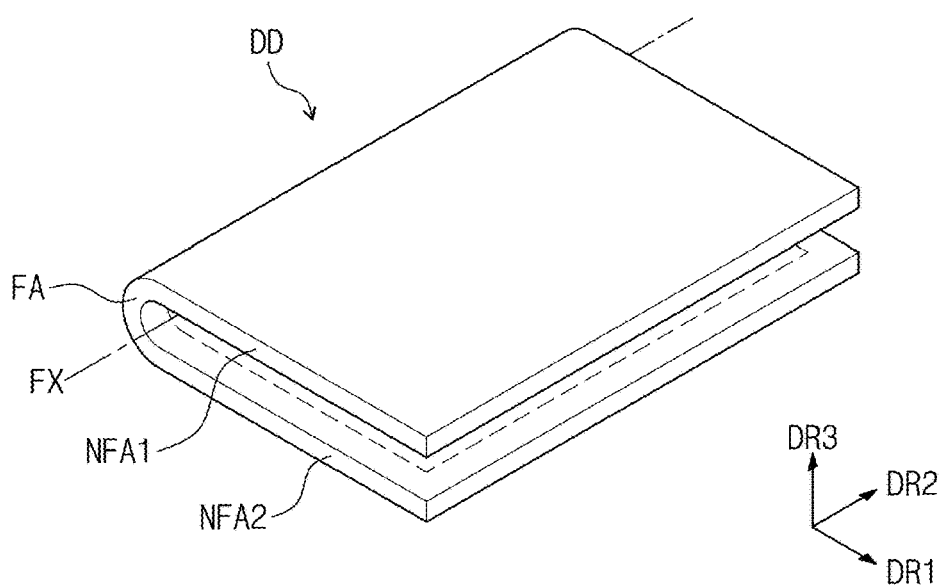
FIG. 2 is a perspective view showing the display device shown in FIG. 1 in a folded state.
Figure 3:
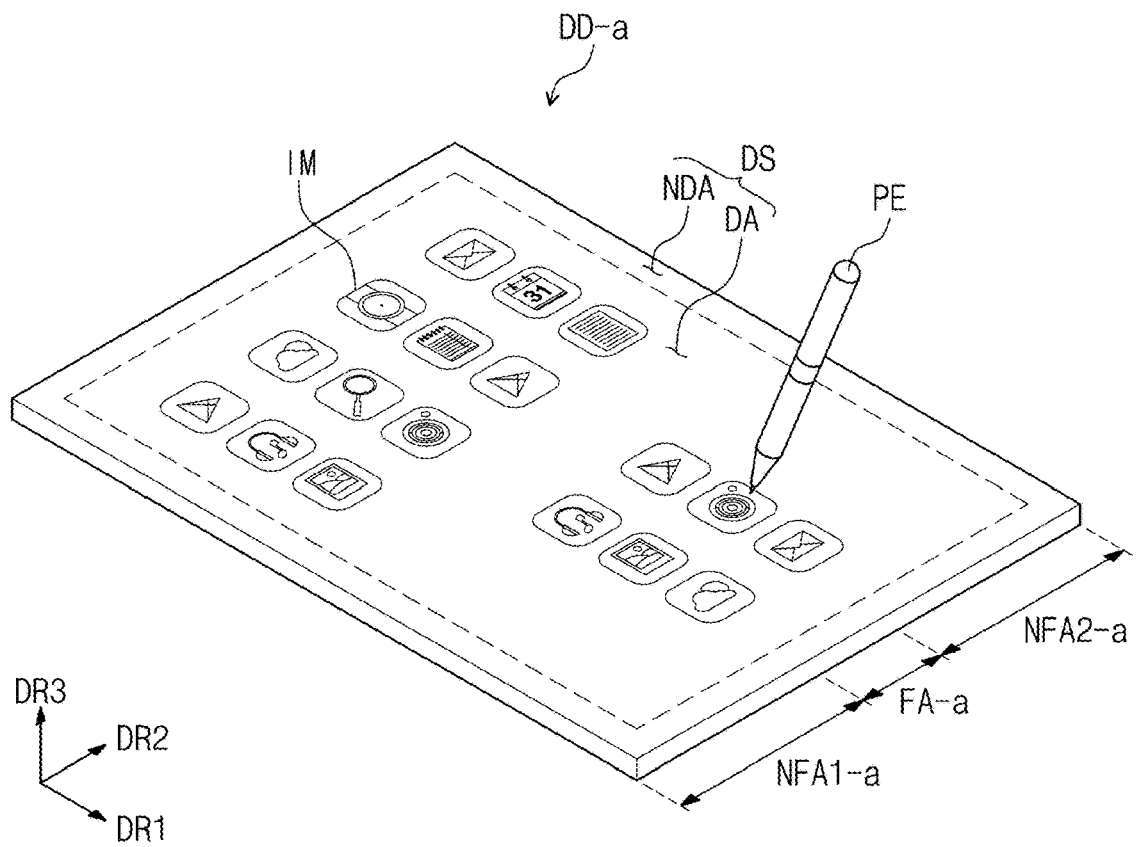
FIG. 3 is a perspective view showing a display device according to an alternative embodiment of the disclosure.
Figure 4:
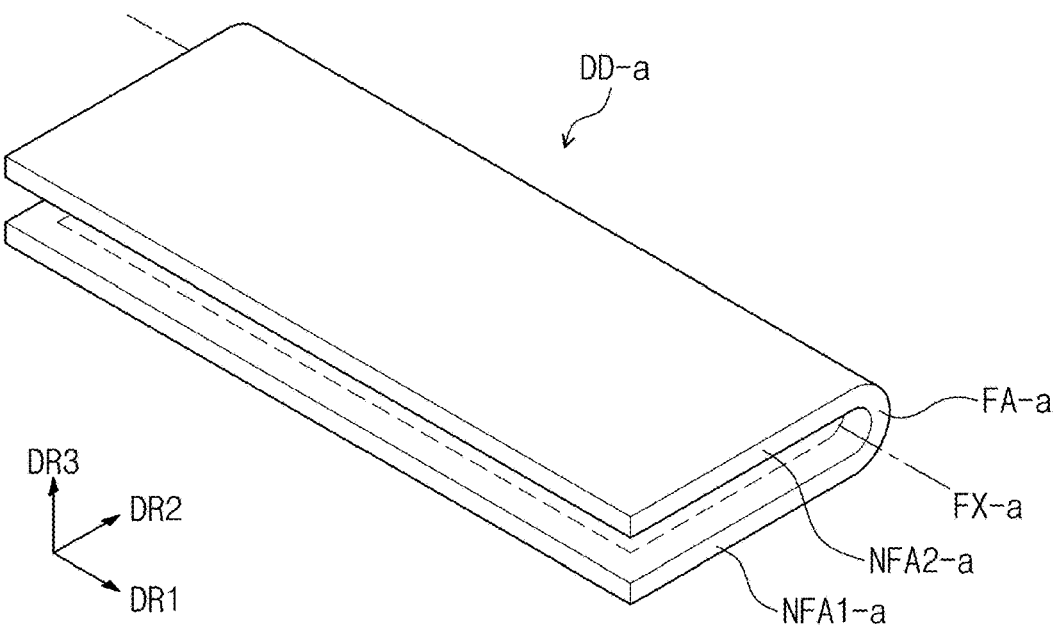
FIG. 4 is a perspective view showing the display device shown in FIG. 3 in a folded state.

FIG. 1 is an assembled perspective view showing a display device DD according to an embodiment of the disclosure. FIG. 2 is a perspective view showing the display device DD shown in FIG. 1 in a folded state. FIG. 3 is a perspective view showing a display device DD-a according to an alternative embodiment of the disclosure. FIG. 4 is a perspective view showing the display device DD-a shown in FIG. 3 in a folded state.

Referring to FIG. 1, an embodiment of the display device DD according to the disclosure may have a rectangular shape defined by long sides extending in a first direction DR1 and short sides extending in a second direction DR2 crossing the first direction DR1. However, the shape of the display device DD is not limited to the rectangular shape, and the display device DD may have one of various shapes, such as a circular shape and a polygonal shape. The display device DD may be a flexible display device.

In an embodiment of the display device DD, a display surface DS, through which an image IM is displayed, is substantially parallel to a plane defined by the first direction DR1 and the second direction DR2. A third direction DR3 indicates a normal line direction of the display surface DS, i.e., a thickness direction of the display device DD. Front (or upper) and rear (or lower) surfaces of each member are distinguished from each other by the third direction DR3. However, directions indicated by the first, second, and third directions DR1, DR2, and DR3 are relative to each other and may be changed to other directions.

The display surface DS of the display device DD may include a display area DA and a non-display area NDA around the display area DA. The display area DA displays the image IM, and the non-display area NDA does not display the image IM. The non-display area NDA surrounds the display area DA and defines an edge or bezel of the display device DD.

The display device DD may sense an external input applied thereto from an outside of the display device DD. The external input may include various types of external inputs. In one embodiment, for example, the external inputs may include external inputs in proximity to or approaching close to the display device DD at a predetermined distance (e.g., a hovering input) as well as a touch input thereon by a part of a user's body, e.g., a hand of a user. In an embodiment, the external input may include various forms, such as force, pressure, heat, or light.

In one embodiment, for example, as shown in FIG. 1, the external input is a pen PE. In such an embodiment, the pen PE may be attached to and detached from an inside or outside portion of the display device DD, and the display device DD may provide or receive signals corresponding to the attachment and detachment of the pen PE.

The display device DD may include a folding area FA and non-folding areas NFA1 and NFA2. Referring to FIGS. 1 and 2, an embodiment of the display device DD may include the folding area FA, a first non-folding area NFA1, and a second non-folding area NFA2. The folding area FA may be defined between the first non-folding area NFA1 and the second non-folding area NFA2, and the first non-folding area NFA1, the folding area FA, and the second non-folding area NFA2 may be sequentially arranged in the first direction DR1 to be adjacent one another.

The folding area FA may be folded about a folding axis FX extending in the second direction DR2.

FIGS. 1 and 2 show an embodiment including a single folding area FA and two non-folding areas NFA1 and NFA2, however, the number of the folding areas and the number of the non-folding areas are not limited thereto or thereby. In one alternative embodiment, for example, the display device DD may include more than two non-folding areas and a plurality of folding areas disposed between the non-folding areas.

The first and second non-folding areas NFA1 and NFA2 of the display device DD may be disposed to be symmetrical with each other with respect to the folding area FA, but not being limited thereto or thereby. According to an alternative embodiment, the folding area FA may be disposed between the first and second non-folding areas NFA1 and NFA2, but the first and second non-folding areas NFA1 and NFA2 may have different areas from each other.

Referring to FIG. 2, the display device DD may be, but not limited to, a foldable display device DD that is folded or unfolded. In one embodiment, for example, the folding area FA may be folded about the folding axis FX substantially parallel to the second direction DR2, and thus, the display device DD may be folded. The folding axis FX may be defined as a minor axis substantially parallel to the short sides of the display device DD.

When the display device DD is folded, the display device DD may be inwardly folded (in-folding) such that the first non-folding area NFA1 and the second non-folding area NFA2 face each other and the display surface DS is not exposed to the outside. However, the embodiment is not limited thereto or thereby, and the display device DD may be outwardly folded (out-folding) such that the display surface DS is exposed to the outside.

FIG. 3 is a perspective view showing the display device DD-a according to an alternative embodiment of the disclosure. FIG. 4 is a perspective view showing the display device DD-a shown in FIG. 3 in a folded state.

The display device DD-a shown in FIG. 3 may have the same configurations as those of the display device DD shown in FIG. 1 except for a folding operation. Accordingly, the folding operation of the display device DD-a will be mainly described below.

Referring to FIGS. 3 and 4, an embodiment of the display device DD-a may include a folding area FA-a, a first non-folding area NFA1-a, and a second non-folding area NFA2-a. The folding area FA-a may be disposed between the first non-folding area NFA1-a and the second non-folding area NFA2-a, and the first non-folding area NFA1-a, the folding area FA-a, and the second non-folding area NFA2-a may be sequentially arranged in the second direction DR2 to be adjacent one another.

The folding area FA-a may be folded about a folding axis FX-a substantially parallel to the first direction DR1, and thus, the display device DD-a may be folded. The folding axis FX-a may be defined as a major axis substantially parallel to the long sides of the display device DD-a.

The display device DD-a shown in FIG. 4 may be inwardly folded (i.e., in-folding) such that the display surface DS is not exposed to the outside. However, the embodiment is not limited thereto or thereby, and the display device DD-a may be folded about the major axis and may be outwardly folded.

Embodiments, where the display device is the foldable display device, are described above with reference to FIGS. 1 to 4, however, the disclosure is not limited thereto or thereby. According to an alternative embodiment, the display device may be a rollable display device, a flat rigid display device, or a curved rigid display device.

In an embodiment, the display device DD may include a tablet computer, a notebook computer, a computer, a smart television, or the like.

Hereinafter, for convenience of description, embodiments where the display device DD is foldable about the minor axis will be described in detail, however, the disclosure is not limited thereto or thereby. In such embodiments, the display device DD-a may be foldable about the major axis.

Figure 5:
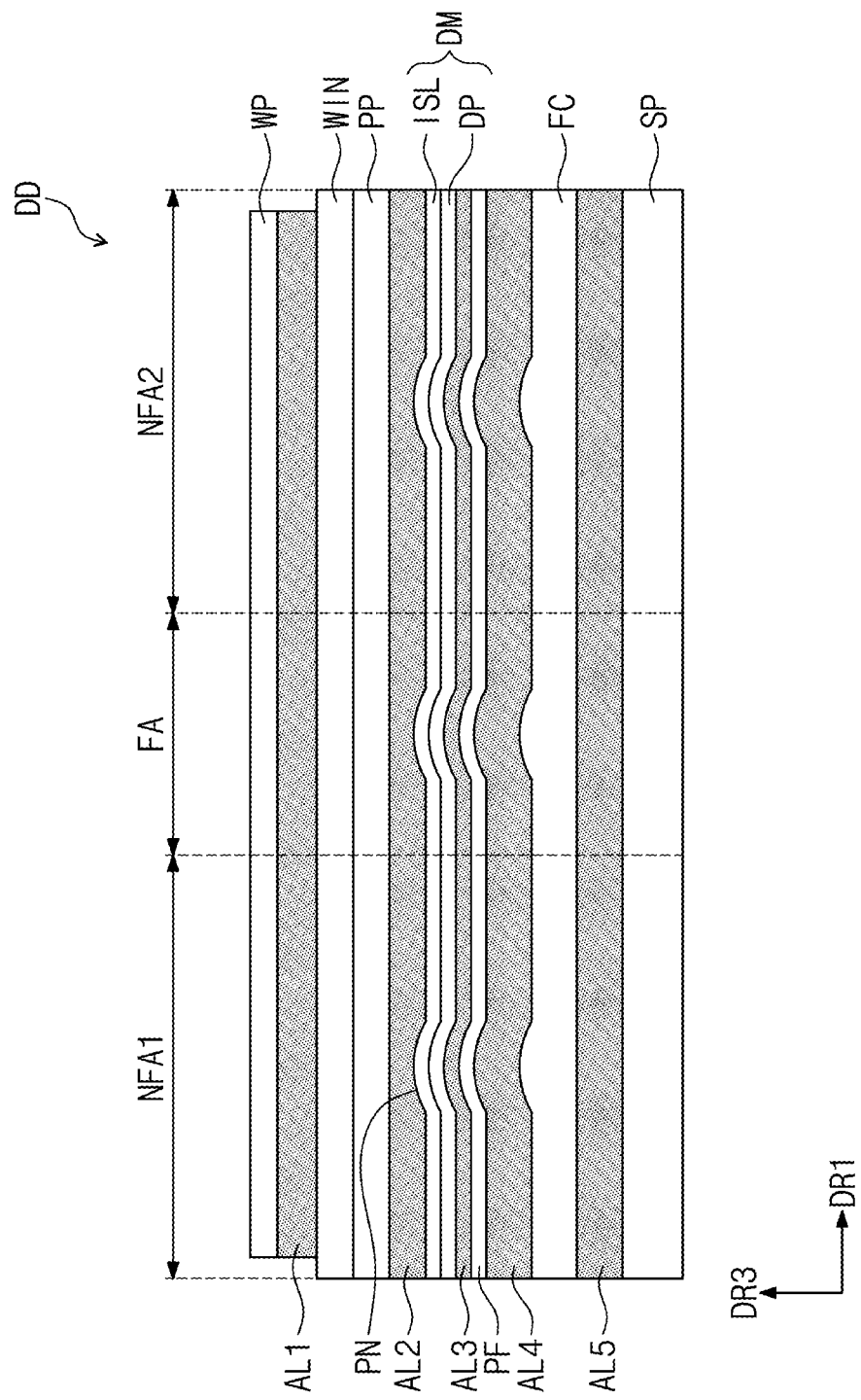
FIG. 5 is a cross-sectional view showing a display device according to an embodiment of the disclosure.

FIG. 5 is a cross-sectional view showing a display device DD according to an embodiment of the disclosure.

Referring to FIG. 5, an embodiment of the display device DD may include a window protective layer WP, a window WIN, an optical film PP, a display module DM, a protective layer PF, a functional layer FC, a support plate SP, and first to fifth adhesive layers AL1 to AL5 disposed therebetween. The first to fifth adhesive layers AL1 to AL5 may attach adjacent components in a stack structure to each other. In one embodiment, for example, the first to fifth adhesive layers AL1 to AL5 may be a pressure sensitive adhesive ("PSA") film, however, the embodiment is not limited thereto or thereby. According to an alternative embodiment, the first to fifth adhesive layers AL1 to AL5 may be an optically clear adhesive ("OCA") film or an optically clear resin ("OCR").

In an embodiment of the disclosure, some of the above-mentioned components or layers of the display device DD may be omitted. In one embodiment, for example, at least one of the first to fifth adhesive layers AL1 to AL5 may be omitted. In an embodiment, the display device DD may further include another component or layer in addition to the above-mentioned components. In one embodiment, for example, the display device DD may further include a light blocking layer, a heat dissipation layer, or the like.

The window WIN may protect the display module DM from external scratches. The window WIN may have an optically transparent property.

The window WIN may include an ultra-thin glass ("UTG"). In detail, the window WIN may include a glass material and may have a thickness equal to or greater than about 20 micrometers (μm) and equal to or less than about 80 μm.

If the thickness of the window is less than about 20 μm, the window may not have sufficient strength and may be easily damaged by external impacts or due to folding and unfolding operations of the display device. If the thickness of the window is greater than about 80 μm, a flexible property of the window may be lowered, and thus, the display device may not be easily folded or unfolded.

In an embodiment of the disclosure, the display device DD may include the window WIN having the thickness equal to or greater than about 20 μm and equal to or less than about 80 μm, such that the display device DD may have a durability against external impacts and may be easily folded and unfolded.

However, materials of the window WIN are not limited thereto or thereby, and alternatively, the window WIN may include a synthetic resin film, e.g., a polyimide film. In an embodiment, the window WIN may further include an anti-fingerprint layer and/or a hard coating layer. Materials of the anti-fingerprint layer and the hard coating layer may be any material known in the art and is not be particularly limited.

The window protective layer WP may be disposed on the window WIN. The window protective layer WP may be detachable from and attachable to the window WIN. The first adhesive layer AL1 that attaches the window protective layer WP to the window WIN may have an adhesion less than that of the second to fifth adhesive layers AL2 to AL5. When the window protective layer WP is damaged by an external pressure, the window protective layer WP may be replaced with a new window protective layer WP.

The window protective layer WP may include a flexible synthetic resin film, such as a polyimide, polyethylene terephthalate, or polyurethane film, as a base layer thereof. The window protective layer WP may overlap the folding area FA and may overlap at least a portion of the first and second non-folding areas NFA1 and NFA2.

The optical film PP may be disposed under the window WIN. The optical film PP will be described later in greater detail with reference to FIGS. 7 and 8.

The display module DM may be disposed under the optical film PP. The display module DM may overlap the first non-folding area NFA1, the folding area FA, and the second non-folding area NFA2.

The display module DM may include a display panel DP. The display panel DP may be a light emitting type display panel, but not being particularly limited. In one embodiment, for example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod.

The display module DM may further include an input sensor ISL. The input sensor ISL may be disposed directly on the display panel. The input sensor ISL may include a plurality of electrodes. The input sensor ISL may sense the external input by a self-capacitance method or a mutual capacitance method. The input sensor ISL may sense an input caused by an active-type input device.

The protective layer PF may be disposed under the display module DM. In an embodiment, the protective layer PF may be disposed under the display panel DP. The protective layer PF may decrease a stress applied to the display module DM when the display device DD is folded. In such an embodiment, the protective layer PF may prevent external moisture from infiltrating into the display module DM and may absorb external impacts.

The protective layer PF may include a synthetic resin film. In one embodiment, for example, the protective layer PF may include a polyimide film, but not being limited thereto or thereby. The protective layer PF may include a plastic film as a base layer thereof. The protective layer PF may include the plastic film including at least one selected from polyethersulfone ("PES"), polyacrylate, polyetherimide ("PEI"), polyethylene naphthalate ("PEN"), polyethylene terephthalate ("PET"), polyphenylene sulfide ("PPS"), polyarylate, polyimide ("PI"), polycarbonate ("PC"), polyarylene ethersulfone, and a combination thereof. The Material of the protective layer PF is not limited to plastic resins and may include an organic-inorganic composite material. The protective layer PF may include a porous organic layer and an inorganic material filled in pores of the organic layer PF.

The functional layer FC may be disposed under the protective layer PF. The functional layer FC may include at least one selected from a cushion layer and a digitizer. The cushion layer may absorb external impacts applied to the display module DM to prevent the display module DM from being damaged. The digitizer may detect a position of the external input applied to the display device.

The support plate SP may be disposed under the functional layer FC. The support plate SP may include a material having an elastic modulus equal to or greater than about 60 gigapascal (GPa). The support plate SP may include a material with strength to prevent the display device DD from being deformed.

The support plate SP may include a metal material such as stainless steel, but not being limited thereto or thereby. The support plate SP may include at least one selected from a variety of metal materials.

Figure 6A:
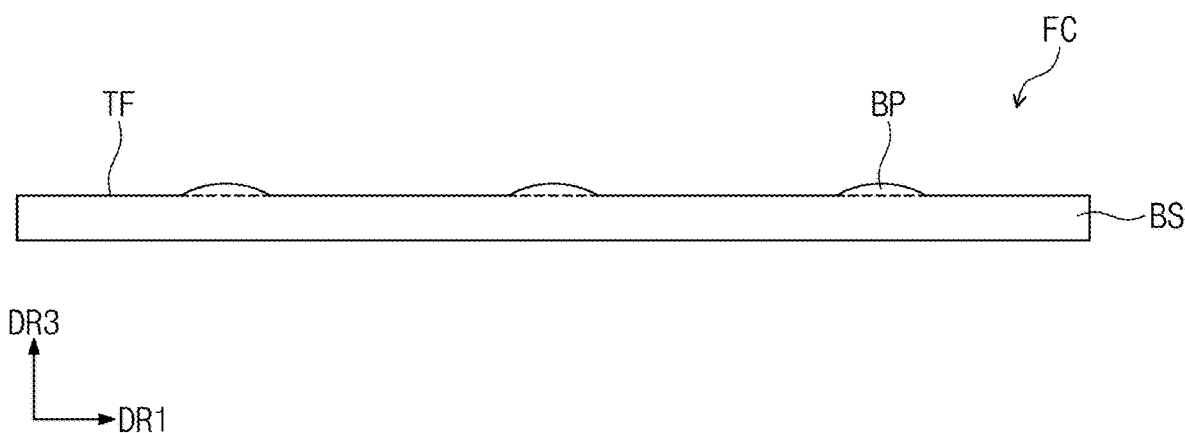
FIG. 6A is a cross-sectional view showing a functional layer according to an embodiment of the disclosure.

FIG. 6A is a cross-sectional view showing the functional layer FC according to an embodiment of the disclosure.

An embodiment of the functional layer FC may include a base layer BS and a bump portion BP. The bump portion BP may have a shape protruded from the base layer BS to the third direction DR3.

In such an embodiment where the functional layer FC of the disclosure includes the bump portion BP, an upper surface TF of the functional layer FC may not be parallel to a plane defined by the first direction DR1 and the second direction DR2.

The functional layer FC may include at least one selected from the cushion layer and the digitizer.

In one embodiment, for example, the functional layer FC may be the cushion layer. In such an embodiment, the functional layer FC may be a foam resin with a predetermined elasticity. In such an embodiment, the functional layer FC may include a flexible material. In one embodiment, example, the base layer BS may include at least one selected from an acrylonitrile butadiene styrene copolymer ("ABS"), polyurethane ("PU"), polyethylene ("PE"), ethylene vinyl acetate ("EVA"), and polyvinyl chloride ("PVC").

Bubbles formed or defined in the cushion layer may form or define the bump portion BP. Each bubble may have, for example, a diameter equal to or greater than about 1 μm.

According to an alternative embodiment, the functional layer FC may be the digitizer. In an embodiment, the digitizer may sense the external input in an electromagnetic resonance ("EMR") method. In one embodiment, for example, when a touch event occurs on the display surface DS (refer to FIG. 1) by the external input, e.g., the pen PE (refer to FIG. 1), a resonant circuit provided in the pen PE (refer to FIG. 1) may generate a magnetic field, and the resonance magnetic field may induce signals in a plurality of coils included in the digitizer. The digitizer may detect the position of the external input based on the signals induced to the coils.

Figure 6B:
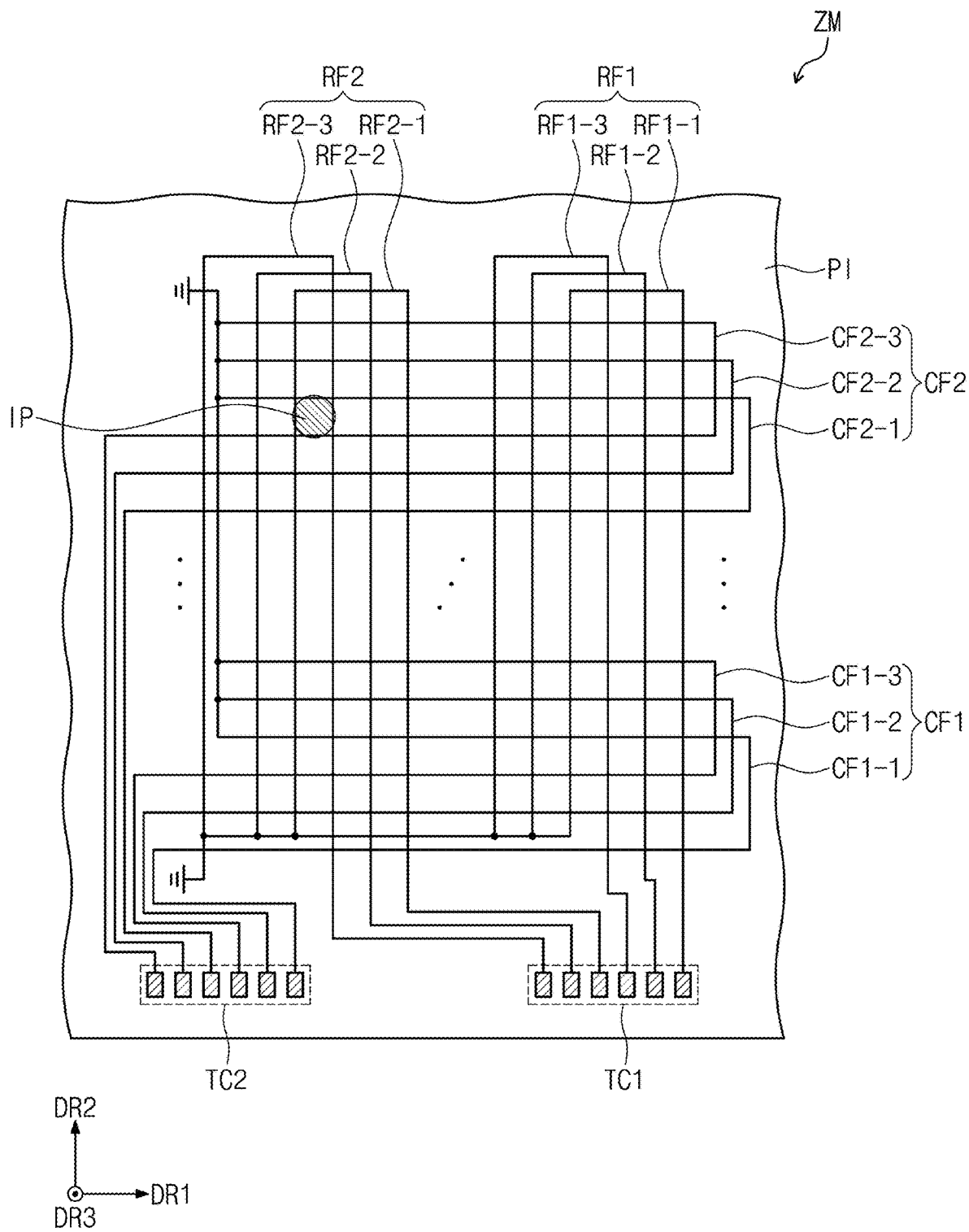
FIG. 6B is a plan view showing a digitizer according to an embodiment of the disclosure.

FIG. 6B is a plan view showing a digitizer according to an embodiment of the disclosure.

Referring to FIG. 6B, an embodiment of the digitizer ZM may include a base resin PI, digitizer sensors CF1, CF2, RF1, and RF2, and a plurality of digitizer pads TC1 and TC2.

The base resin PI may be a base layer on which the digitizer sensors RF1, RF2, CF1, and CF2 are disposed. The base resin PI may include an organic material. In one embodiment, for example, the base resin PI may include PI.

First digitizer sensors RF1 and RF2 may include a plurality of first sensing lines RF1-1, RF1-2, RF1-3, RF2-1, RF2-2, and RF2-3, and second digitizer sensors CF1 and CF2 may include a plurality of second sensing lines CF1-1, CF1-2, CF1-3, CF2-1, CF2-2, and CF2-3.

The first sensing lines RF1-1, RF1-2, RF1-3, RF2-1, RF2-2, and RF2-3 may extend in the second direction DR2. The first sensing lines RF1-1, RF1-2, RF1-3, RF2-1, RF2-2, and RF2-3 may be arranged in the first direction DR1 and may be spaced apart from each other.

The second sensing lines CF1-1, CF1-2, CF1-3, CF2-1, CF2-2, and CF2-3 may extend in the first direction DR1. The second sensing lines CF1-1, CF1-2, CF1-3, CF2-1, CF2-2, and CF2-3 may be arranged in the second direction DR2 and may be spaced apart from each other.

The first digitizer sensors RF1 and RF2 may correspond to input coils of the digitizer ZM operated in the EMR method, and the second digitizer sensors CF1 and CF2 may correspond to output coils of the digitizer ZM operated in the EMR method.

The first sensing lines RF1-1, RF1-2, RF1-3, RF2-1, RF2-2, and RF2-3 may be disposed to be insulated from the second sensing lines CF1-1, CF1-2, CF1-3, CF2-1, CF2-2, and CF2-3 in the base resin PI. Each of the first sensing lines RF1-1, RF1-2, RF1-3, RF2-1, RF2-2, and RF2-3 may be connected to corresponding first digitizer pads TC1, and each of the second sensing lines CF1-1, CF1-2, CF1-3, CF2-1, CF2-2, and CF2-3 may be connected to corresponding second digitizer pads TC2.

The first sensing lines RF1-1, RF1-2, RF1-3, RF2-1, RF2-2, and RF2-3 may respectively receive scan signals activated in different periods from each other. Each of the first sensing lines RF1-1, RF1-2, RF1-3, RF2-1, RF2-2, and RF2-3 may generate a magnetic field in response to a corresponding scan signal.

When the pen PE (refer to FIG. 1) approaches the first sensing lines RF1-1, RF1-2, RF1-3, RF2-1, RF2-2, and RF2-3, the magnetic field induced from the first sensing lines RF1-1, RF1-2, RF1-3, RF2-1, RF2-2, and RF2-3 may resonate with a resonant circuit of the pen PE (refer to FIG. 1), and the pen PE (refer to FIG. 1) may generate a resonant frequency. In an embodiment, the pen PE (refer to FIG. 1) may include an LC resonant circuit including an inductor and a capacitor.

The second sensing lines CF1-1, CF1-2, CF1-3, CF2-1, CF2-2, and CF2-3 may output sensing signals corresponding to the resonant frequency of the input device to the second digitizer pads TC2.

Herein, a center of an area where a second coil RF2-2 among the first sensing lines RF1-1, RF1-2, RF1-3, RF2-1, RF2-2, and RF2-3 crosses a second coil CF2-2 among the second sensing lines CF1-1, CF1-2, CF1-3, CF2-1, CF2-2, and CF2-3 is referred to as an input position IP.

The sensing signal output from the second coil RF2-2 among the first sensing lines RF1-1, RF1-2, RF1-3, RF2-1, RF2-2, and RF2-3 may have a higher level than that of the sensing signals output from the other first sensing lines RF1-1, RF1-2, RF1-3, RF2-1, and RF2-3.

The sensing signal output from the second coil CF2-2 among the second sensing lines CF1-1, CF1-2, CF1-3, CF2-1, CF2-2, and CF2-3 may have a higher level than that of the sensing signals output from the other second sensing lines CF1-1, CF1-2, CF1-3, CF2-1, and CF2-3.

The sensing signals output from a first coil CF2-1 and a third coil CF2-3 among the second sensing lines CF1-1, CF1-2, CF1-3, CF2-1, CF2-2, and CF2-3 may have a lower level than that of the sensing signal output from the second coil CF2-2, and the sensing signals output from the first coil CF2-1 and the third coil CF2-3 among the second sensing lines CF1-1, CF1-2, CF1-3, CF2-1, CF2-2, and CF2-3 may have a higher level than that of the sensing signals output from the other second sensing lines CF1-1, CF1-2, and CF1-3. Two-dimensional coordinate information of the input position IP generated by the pen PE (refer to FIG. 1) may be calculated based on a time at which the sensing signal output from the second coil CF2-2 having the high level is sensed and a relative position of the second coil CF2-2 with respect to the second sensing lines CF1-1, CF1-2, CF1-3, CF2-1, and CF2-3.

Referring to FIGS. 6A and 6B, in an embodiment where the functional layer FC is the digitizer ZM, the base layer BS may be the base resin PI, and the bump portion BP may be the digitizer sensors CF1, CF2, RF1, and RF2. The bump portion BP may be formed due to the thickness of the digitizer sensors CF1, CF2, RF1, and RF2 disposed on the base resin PI. In one embodiment, for example, the thickness of the digitizer sensors CF1, CF2, RF1, and RF2 may be equal to or greater than about 5 μm.

Referring back to FIG. 5, an embodiment of the display device DD of the disclosure may include the functional layer FC including the bump portion BP (refer to FIG. 6A), and thus, the component disposed on the functional layer FC may have a bump shape. In one embodiment, for example, the protective layer PF, the display module DM, and the second to fourth adhesive layers AL2 to AL4 may include a flexible material. Portions of each of the protective layer PF, the display module DM, and the second to fourth adhesive layers AL2 to AL4 disposed on the functional layer FC to overlap the bump portion BP may have a bump shape PN protruded to the third direction DR3 along the bump portion BP.

In an embodiment, the bump portion BP may have the bump shape protruded from the base layer BS to the third direction DR3 as shown in FIGS. 5 and 6A, but not being limited thereto or thereby. Alternatively, the bump portion BP may have a recessed shape.

In such an embodiment, portions of each of the protective layer PF, the display module DM, and the second to fourth adhesive layers AL2 to AL4 disposed on the functional layer FC to overlap the bump portion BP may have a bump shape protruded to a direction opposite to the third direction DR3 along the bump portion BP.

FIG. 5 shows an embodiment where the display device DD includes a single functional layer FC, but not being limited thereto. Alternatively, the functional layer FC may be provided in plural. The functional layers FC may be disposed on or under the support plate SP.

Figure 7:
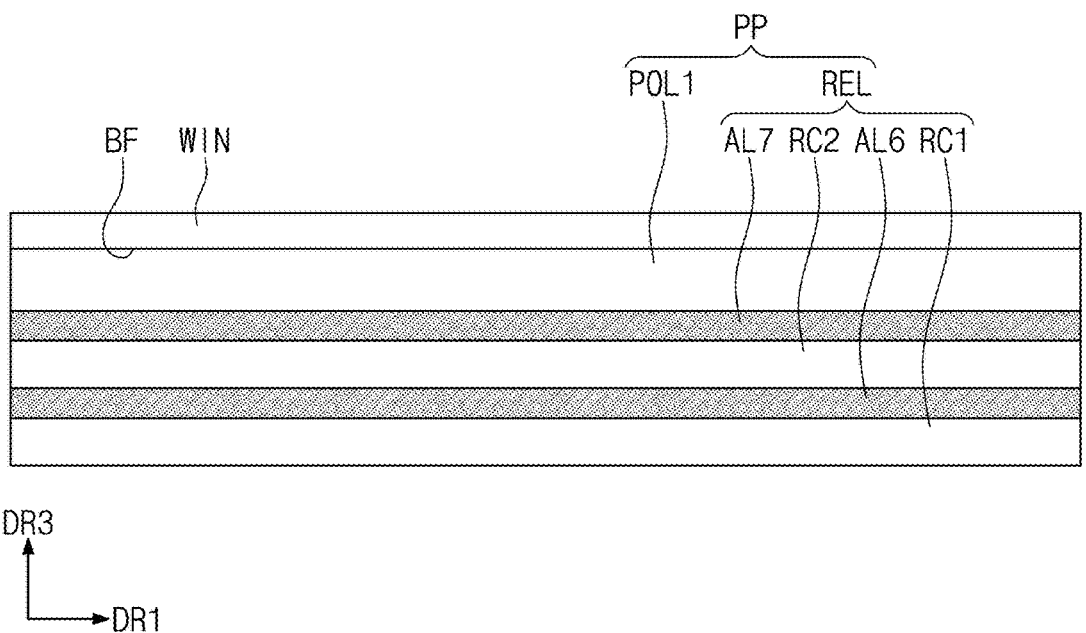
FIGS. 7 and 8 are cross-sectional views showing some components of display devices according to embodiments of the disclosure.
Figure 8:
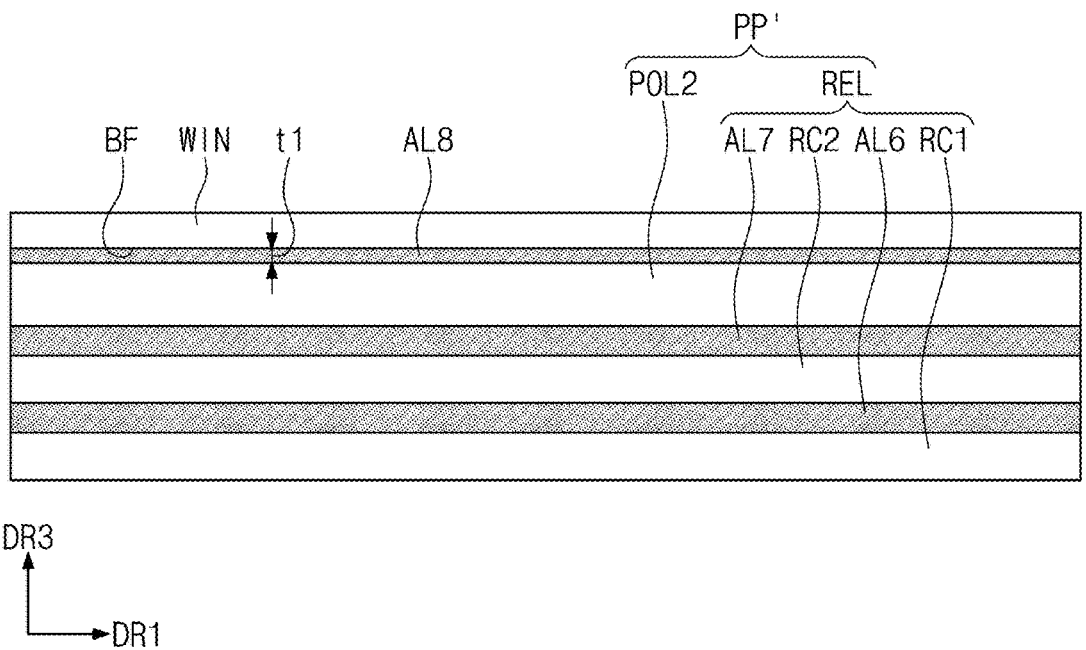

FIGS. 7 and 8 are cross-sectional views showing some components of display devices DD (refer to FIG. 5) according to embodiments of the disclosure.

FIG. 7 shows a window WIN and an optical film PP disposed under the window WIN. The optical film PP may include a polarizing layer POL1 disposed under the window WIN and a retard layer REL disposed under the polarizing layer POL1. The polarizing layer POL1 may be a linear polarizer that linearly polarizes a light incident thereto in one direction.

In an embodiment, the retard layer REL may be a retarder. In one embodiment, for example, the retard layer REL may include a first retard layer RC1 and a second retard layer RC2. The second retard layer RC2 may be disposed on the first retard layer RC1.

The first retard layer RC1, the second retard layer RC2, and the polarizing layer POL1 of the optical film PP may be sequentially stacked one on another in the third direction DR3.

In an embodiment, a sixth adhesive layer AL6 may be disposed between the first retard layer RC1 and the second retard layer RC2, and a seventh adhesive layer AL7 may be disposed between the second retard layer RC2 and the polarizing layer POL1. In an embodiment of the display device DD, the first retard layer RC1 may be disposed closer to the display module DM that the polarizing layer POL1 is.

The first retard layer RC1 may be an optical layer to retard a phase of the light incident thereto. The first retard layer RC1 may be an optical layer to retard the phase of the light incident thereto by about $\lambda/4$. The first retard layer RC1 may be a $\lambda/4$ retarder. The first retard layer RC1 may have an optically anisotropic property and may change a polarizing state of the light incident thereto. In such an embodiment, the light incident to the first retard layer RC1 after passing through the polarizing layer POL1 may be changed to a circularly-polarized state from a linearly-polarized state. In such an embodiment, the light incident to the first retard layer RC1 in the circularly-polarized state may be changed to the linearly-polarized state.

In an embodiment of the optical film PP, the second retard layer RC2 may be disposed between the first retard layer RC1 and the polarizing layer POL1. The second retard layer RC2 may be an optical layer to retard a light incident thereto by about $\lambda/2$. The second retard layer RC2 may be a $\lambda/2$ retarder.

The second retard layer RC2 may change a polarizing state of the light incident thereto. A polarizing direction of the linearly-polarized light incident to the second retard layer RC2 from the polarizing layer POL1 may be changed.

In an embodiment, the first retard layer RC1 and the second retard layer RC2 may be formed or defined only by a liquid crystal coating layer without a base layer that is a supporter. In such an embodiment where the first retard layer RC1 and the second retard layer RC2, which are formed or defined only by the liquid crystal coating layer without the base layer, are applied to the optical film PP, a total thickness of the display device DD (refer to FIG. 5) may be reduced. In such an embodiment, the first retard layer RC1 and the second retard layer RC2, which are formed or defined by the liquid crystal coating layer, may be used to reduce the thickness of the optical film PP, and thus, the display device DD may be more easily folded or bent.

In an embodiment, the display module DM, and the second to fourth adhesive layers AL2 to AL4, the optical film PP may not have the bump shape. In such an embodiment, the polarizing layer POL1 of the optical film PP may include an upper surface and a lower surface, which are substantially parallel to a plane defined by the first direction DR1 and the second direction DR2. In such an embodiment, the polarizing layer POL1 may include a flat surface.

In an embodiment, the polarizing layer POL1 may be a coating layer coated on a lower portion or a lower surface of the window WIN. In such an embodiment, the polarizing layer POL1 may be directly coated on a lower surface BF of the window WIN. In one embodiment, for example, the polarizing layer POL1 may be a coating layer formed by coating a polyvinylalcohol-based material or liquid crystal molecules on the lower surface Bf of the window WIN. The polarizing layer POL1 of the disclosure may not include a separate base substrate and may be formed by employing the lower surface BF of the window WIN as a base surface thereof.

In such an embodiment where the polarizing layer POL1 is directly coated on the lower surface BF of the window WIN, a shape of the polarizing layer POL1 may be influenced by the window WIN. In an embodiment, where the window WIN is an ultra-thin glass, the shape of the polarizing layer POL1 may be maintained by a strength of the window WIN without any additional deformation despite the pressure or stress. In one embodiment, for example, the polarizing layer POL1 may maintain a surface thereof substantially flat. The display device DD may provide an image with high quality to the user due to the flat surface of the polarizing layer POL1.

In an embodiment, the reflection of the external light, which is caused by the step difference or stepped structure between the protective layer PF, the display module DM, and the second to fourth adhesive layers AL2 to AL4, may be effectively prevented by the retard layer REL disposed under the polarizing layer POL1.

Referring to FIG. 8, in an alternative embodiment, an eighth adhesive layer AL8 may be further disposed between a window WIN and an optical film PP'. In such an embodiment, the optical film PP' may be attached to a lower surface BF of the window WIN by the eighth adhesive layer AL8. A separate component may not be present between the window WIN and the optical film PP' other than the eighth adhesive layer AL8.

The optical film PP' may include a retard layer REL and the polarizing layer POL2 disposed on the retard layer REL. The retard layer REL shown in FIG. 8 is substantially the same as the retard layer REL shown in FIG. 7, and any repetitive detailed description thereof will be omitted.

The polarizing layer POL2 may be in contact with the eighth adhesive layer AL8. The eighth adhesive layer AL8 may have a thickness t1 less than about 5 μm. In one embodiment, for example, the thickness t1 of the eighth adhesive layer AL8 may be equal to or greater than about 0.1 μm and equal to or less than about 4 μm.

The polarizing layer POL2 may be a linear polarizer and may be any linear polarizer known in the art. In one embodiment, for example, the polarizing layer POL2 may be a film-type linear polarizer including a stretched polymer film. In such an embodiment, the stretched polymer film may be a stretched polyvinylalcohol film, for example.

The polarizing layer POL2 may be formed by allowing dichroic dye to be adsorbed onto the stretched polymer film. In one embodiment, for example, the polarizing layer POL2 may be formed by allowing iodine to be adsorbed onto the stretched polyvinylalcohol film. In such an embodiment, a direction in which the stretched polymer film is stretched may be an adsorption axis of the polarizing layer POL2, and a direction substantially perpendicular to the stretched direction may be a transmission axis of the polarizing layer POL2.

Hereinafter, features of embodiments of the disclosure will be described with reference to embodiment examples and comparative examples. However, embodiments of the display device of the disclosure are not limited to such embodiments.

Hereinafter, evaluation on visibility of the step difference inside the display device will be described.

Table 1 (show below) shows the results of evaluation of whether the step difference inside the display device is visually recognized by the user's naked eye on the display devices according to embodiment examples 1 to 3 and comparative examples 1 to 6.

In Table 1, UTG or a clear polyimide ("CPI") is used as a material of the window.

In addition, in Table 1, the liquid crystal coating layer formed by coating the liquid crystal molecules on the lower surface of the window or the polarizing layer formed by allowing the iodine to be adsorbed onto the polyvinylalcohol ("PVA") film is used as the polarizing layer. Here, the liquid crystal coating layer formed by coating the liquid crystal molecules on the lower surface of the window may correspond to the polarizing layer POL1 described above with reference to FIG. 7, and the polarizing layer formed by allowing the iodine to be adsorbed onto the PVA film may correspond to the polarizing layer POL2 described above with reference to FIG. 8.

In Table 1, no separate component is present between the window and the polarizing layer or only the PSA film having a thickness of about 4 µm, about 5 µm, about 10 µm, or about 15 µm is present between the window and the polarizing layer. When no separate component is present between the window and the polarizing layer, the polarizing layer is coated on the lower portion of the window.

In Table 1, each functional layer includes a cushion layer or a digitizer, which has a bump portion. Here, the bump portion of the functional layer may correspond to the functional layer FC, the cushion layer, and the digitizer ZM described above with reference to FIGS. 5, 6A, and 6B. Here, the bump portion of the functional layer may be understood as the step difference inside the display device.

TABLE 1

| | Window | Polarizer | Component disposed between window and polarizer | Functional layer | Whether step difference is recognized by user |
|---|---|---|---|---|---|
| Embodiment example 1 | UTG | Liquid crystal coating layer | — | Cushion layer | x |
| Embodiment example 2 | UTG | PVA + Iodine | PSA(4 µm) | Cushion layer | x |
| Embodiment example 3 | UTG | PVA + Iodine | PSA(4 µm) | Digitizer | x |
| Comparative example 1 | UTG | PVA + Iodine | PSA(5 µm) | Cushion layer | Δ |
| Comparative example 2 | UTG | PVA + Iodine | PSA(10 µm) | Digitizer | Δ |
| Comparative example 3 | UTG | PVA + Iodine | PSA(15 µm) | Cushion layer | O |
| Comparative example 4 | UTG | PVA + Iodine | PSA(15 µm) | Digitizer | O |
| Comparative example 5 | CPI | Liquid crystal coating layer | — | Cushion layer | O |
| Comparative example 6 | CPI | PVA + Iodine | PSA(10 µm) | Cushion layer | O |

Referring to results of Table 1, the step difference inside the display devices of embodiment examples 1 to 3 is not recognized by the user.

The step difference inside the display devices of comparative example 1 and comparative example 2 is slightly recognized by the user. The step different inside of comparative example 3 to comparative example 6 is recognized by the user. In the case of comparative examples 1 to 6, the step difference occurs in the polarizing layer due to the step difference of the functional layer, and the user views the step difference of the polarizing layer.

Referring to results of embodiment example 1 and comparative example 5, when the window includes the UTG, it is observed that the step difference inside the display device is not recognized by the user even though the polarizing layer is the liquid crystal coating layer, and when the window includes the CPI, it is observed that the step difference inside the display device is recognized by the user even though the polarizing layer is the liquid crystal coating layer.

Since the modulus of the window that includes the UTG is greater than that of the window that includes the CPI, the deformation of the window, which is caused by the step difference inside the display device, may be reduced. When the window includes the UTG, for example, the deformation of the window due to the bump shape PN shown in FIG. 5 may be reduced.

In addition, the deformation caused by the polarizing layer directly coated on the lower surface of the window may be reduced. Accordingly, the visibility of the step difference inside the display device to the user may be reduced.

In an embodiment of the display device in which the window includes the UTG and the polarizing layer is the coating layer as embodiment example 1, the polarizing layer coated directly on the lower portion of the window may maintain a shape thereof uniformly by the strength of the window regardless of the pressure or stress therearound. In such an embodiment, the shape of the polarizing layer may maintain the flat surface as the shape of the window.

Since the polarizing layer may maintain its flat surface, the display surface with flatness may be recognized by the user even though the step difference exists inside the display device. The display device may provide the improved display quality to the user.

When comparing the results of embodiment examples 2 and 3 and comparative examples 1 to 4, the step difference inside the display device is recognized by the user even though the window includes the UTG when the thickness of the PSA of the display device is equal to or greater than about 5 µm. When the thickness of the PSA is about 4 µm as embodiment examples 2 and 3, the polarizing layer may maintain its flat shape according to the shape of the window since the gap between the polarizing layer and the window is small.

In an embodiment of the display device as comparative example 6, the window includes the CPI and the adhesive layer having the thickness of about 10 μm is disposed between the window and the polarizing layer, and thus, the strength of the window may hardly affect the polarizing layer. In one embodiment, for example, the polarizing layer is deformed by the step difference occurring in the functional layer, and the step difference inside the display device is recognized by the user.

In an embodiment where the display device includes the functional layer with the step difference, the display device may include the polarizing layer that is coated directly on the lower portion of the window or attached to the lower portion of the window by the adhesive layer having the thickness less than about 5 μm, and thus, the polarizing layer may provide the flat surface to the user. Accordingly, the user may view the image with improved quality due to the polarizing layer that is flat regardless of the step difference inside the display device. Embodiments of the display device according to the disclosure may provide the improved display quality of the user.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a window including a glass material and having a thickness equal to or greater than about 20 micrometers and equal to or less than about 80 micrometers;
    a polarizing layer disposed directly on a lower portion of the window or attached to the lower portion of the window by an adhesive layer having a thickness equal to or greater than about 0.1 micrometer and equal to or less than about 4 micrometers;
    a retard layer disposed under the polarizing layer;
    a display panel disposed under the polarizing layer; and
    a functional layer disposed under the display panel,
    wherein the functional layer comprises at least one selected from a cushion layer including a foam resin and a digitizer, and
    wherein the functional layer includes a base layer and a bump portion protruding or recessing from the base layer.

2. The display device of claim 1, wherein the retard layer is disposed between the polarizing layer and the display panel.

3. The display device of claim 1, wherein the polarizing layer is a coating layer.

4. The display device of claim 1, wherein the base layer of the functional layer is a base resin of the digitizer.

5. The display device of claim 4, wherein the digitizer has a thickness equal to or greater than about 5 micrometers.

6. The display device of claim 1, wherein the bump portion is defined in the foam resin of the cushion layer in a bubble shape having a diameter equal to or greater than about 1 micrometer.

7. The display device of claim 1, wherein the retard layer comprises:
    a first retard layer disposed under the polarizing layer; and
    a second retard layer disposed between the first retard layer and the polarizing layer.

8. The display device of claim 7, wherein
    the first retard layer is a $\lambda/4$ retarder, and
    the second retard layer is a $\lambda/2$ retarder.

9. The display device of claim 1, wherein the polarizing layer is a linear polarizer.

10. The display device of claim 1, wherein the window comprises a glass material.

11. The display device of claim 1, wherein the window has a thickness equal to or greater than about 20 micrometers and equal to or less than about 80 micrometers.

12. The display device of claim 1, wherein the display panel is foldable about a folding axis.

13. A display device comprising:
    a window including a glass material and having a thickness equal to or greater than about 20 micrometers and equal to or less than about 80 micrometers;
    a coating layer coated on a lower portion of the window;
    a retard layer disposed under the coating layer; and
    a display panel disposed under the coating layer; and
    a functional layer disposed under the display panel,
    wherein the coating layer comprises a polarizing material,
    wherein the functional layer comprises at least one selected from a cushion layer including a foam resin and a digitizer, and
    wherein the functional layer includes a base layer and a bump portion protruding or recessing from the base layer.

14. The display device of claim 13, wherein the retard layer comprises:
    a first retard layer disposed under the coating layer; and
    a second retard layer disposed between the first retard layer and the coating layer,
    wherein the first retard layer is a $\lambda/4$ retarder, and
    wherein the second retard layer is a $\lambda/2$ retarder.

15. The display device of claim 13, wherein
    the base layer of the functional layer is a base resin of the digitizer, or
    the bump portion is defined in the foam resin of the cushion layer in a bubble shape having a diameter equal to or greater than about 1 micrometer.

16. The display device of claim 13, further comprising: a support plate disposed under the display panel.

17. A display device comprising:
    a window;
    an adhesive layer disposed under the window;
    a polarizing layer disposed under the adhesive layer; and
    a display panel disposed under the polarizing layer; and
    a functional layer disposed under the display panel,
    wherein the adhesive layer has a thickness equal to or greater than about 0.1 micrometer and equal to or less than about 4 micrometers,
    wherein the functional layer comprises at least one selected from a cushion layer including a foam resin and a digitizer, and
    wherein the functional layer includes a base layer and a bump portion protruding or recessing from the base layer.

18. The display device of claim 17, wherein
    the adhesive layer is disposed directly on a lower portion of the window, and
    the polarizing layer is disposed directly on a lower portion of the adhesive layer.

19. The display device of claim 17, wherein
the base layer of the functional layer is a base resin of the digitizer, or
the bump portion is defined in the foam resin of the cushion layer in a bubble shape having a diameter equal to or greater than about 1 micrometer.

20. The display device of claim 17, further comprising:
a first retard layer disposed under the polarizing layer; and
a second retard layer disposed between the first retard layer and the polarizing layer,
wherein the first retard layer is a $\lambda/4$ retarder, and
wherein the second retard layer is a $\lambda/2$ retarder.

* * * * *